US007485874B2

(12) United States Patent
Nakamura et al.

(10) Patent No.: US 7,485,874 B2
(45) Date of Patent: Feb. 3, 2009

(54) APPARATUS FOR MANUFACTURING SEMICONDUCTOR SUBSTRATES

(75) Inventors: Seiichi Nakamura, Tokyo (JP); Hideki Nishihata, Tokyo (JP); Riyuusuke Kasamatsu, Tokyo (JP); Kazunori Tsubuku, Hitachi (JP); Akira Bando, Hitachi (JP); Nobuo Tsumaki, Ushiku (JP); Tomoji Watanabe, Tsuchiura (JP); Kazuo Mera, Hitachi (JP); Tsuneo Hayashi, Naka (JP); Yoichi Kurosawa, Hitachi (JP)

(73) Assignee: Sumco Corporation, Tokyo (JP)

( * ) Notice: Subject to any disclaimer, the term of this patent is extended or adjusted under 35 U.S.C. 154(b) by 137 days.

(21) Appl. No.: 11/510,277

(22) Filed: Aug. 24, 2006

(65) Prior Publication Data

US 2007/0114458 A1    May 24, 2007

(30) Foreign Application Priority Data

Aug. 25, 2005   (JP)   ............................. 2005-244656

(51) Int. Cl.
*G01N 21/00* (2006.01)
*G01N 23/00* (2006.01)
*G21K 5/10* (2006.01)
*G21K 5/08* (2006.01)
*H01J 37/08* (2006.01)
*H01J 37/20* (2006.01)

(52) U.S. Cl. .................... 250/443.1; 250/398; 250/400; 250/440.11; 250/442.11

(58) Field of Classification Search ............... 250/398, 250/400, 440.11, 442.11, 443.1, 492.1, 492.2, 250/492.21, 492.22

See application file for complete search history.

(56) References Cited

U.S. PATENT DOCUMENTS

| 3,845,312 | A | * | 10/1974 | Allison, Jr. ................... 250/398 |
| 4,873,447 | A | * | 10/1989 | Imahashi ................... 250/492.2 |
| 4,883,968 | A |   | 11/1989 | Hipple et al. |
| 5,004,924 | A | * | 4/1991  | Imahashi ............... 250/442.11 |
| 5,134,301 | A | * | 7/1992  | Kamata et al. ........... 250/492.2 |
| 5,244,820 | A | * | 9/1993  | Kamata et al. .............. 438/514 |
| 5,525,807 | A | * | 6/1996  | Hirokawa et al. ...... 250/492.21 |
| 5,608,223 | A | * | 3/1997  | Hirokawa et al. ...... 250/442.11 |
| 5,932,883 | A | * | 8/1999  | Hashimoto et al. ..... 250/492.21 |
| 6,570,171 | B2 |  | 5/2003  | Tomita et al. |
| 6,614,190 | B2 |  | 9/2003  | Tomita et al. |

(Continued)

OTHER PUBLICATIONS

Japanese Unexamined Patent Application, First Publication No. 2002-231176 corresponding to U.S. Patent No. 6,614,190.

*Primary Examiner*—David A. Vanore
*Assistant Examiner*—Bernard E Souw
(74) *Attorney, Agent, or Firm*—Kolisch Hartwell, PC

(57) ABSTRACT

This apparatus for manufacturing semiconductor substrates has support disks and holding units holding semiconductor substrates on the support disks. The holding unit has a stopper which is formed of a conductive material and holds the brim of the semiconductor substrate, a stopper holder which supports the stopper at the outer circumferential portion thereof, a retaining member which retains the stopper to the support disk, and a heating unit which heats the stopper.

14 Claims, 10 Drawing Sheets

U.S. PATENT DOCUMENTS

| | | | |
|---|---|---|---|
| 6,667,485 B2 * | 12/2003 | Tomita et al. | 250/492.21 |
| 6,667,486 B2 * | 12/2003 | Ohta et al. | 250/492.22 |
| 7,217,934 B2 * | 5/2007 | Mori | 250/440.11 |
| 7,314,785 B2 * | 1/2008 | Yamazaki et al. | 438/149 |
| 2005/0087769 A1 * | 4/2005 | Yamazaki et al. | 257/202 |
| 2005/0218336 A1 * | 10/2005 | Mori | 250/440.11 |
| 2007/0114458 A1 * | 5/2007 | Nakamura et al. | 250/492.21 |
| 2008/0105877 A1 * | 5/2008 | Yamazaki et al. | 257/72 |

* cited by examiner

FIG. 3
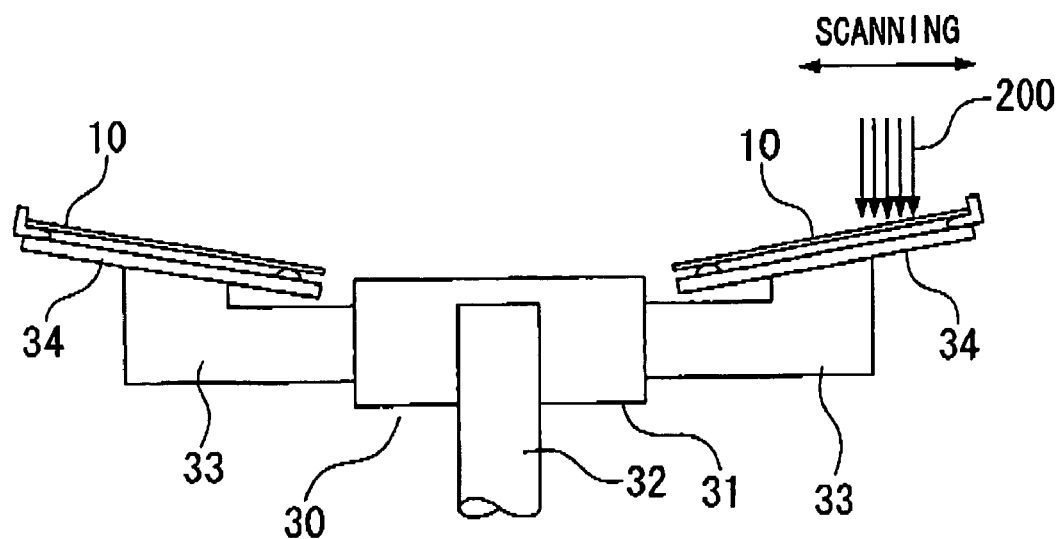
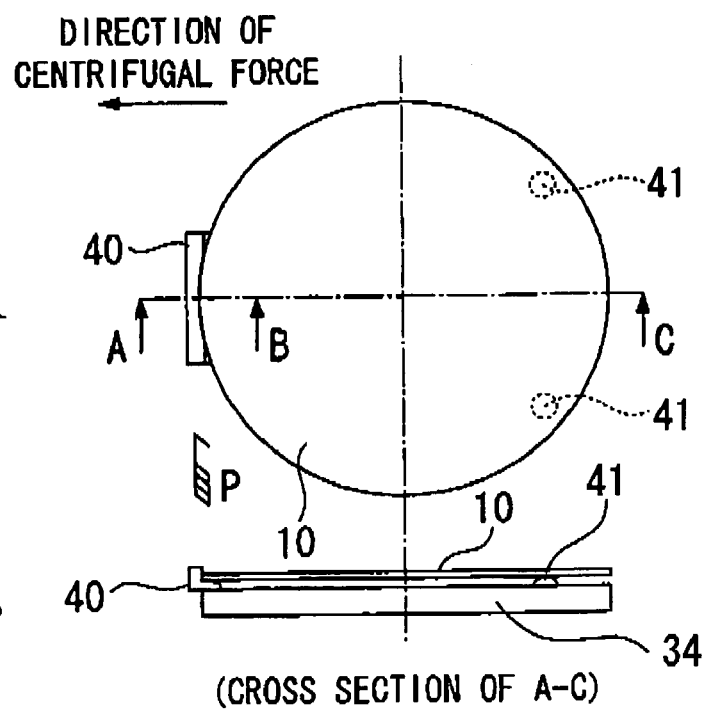
FIG. 4A
FIG. 4B
(CROSS SECTION OF A-C)

FIG. 5A
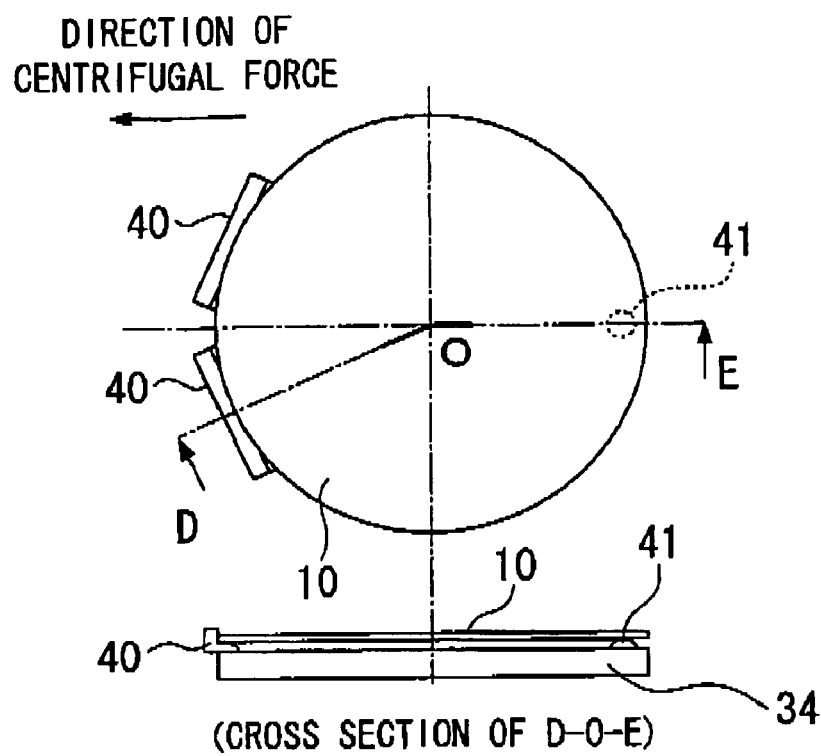
FIG. 5B
(CROSS SECTION OF D-O-E)
FIG. 6
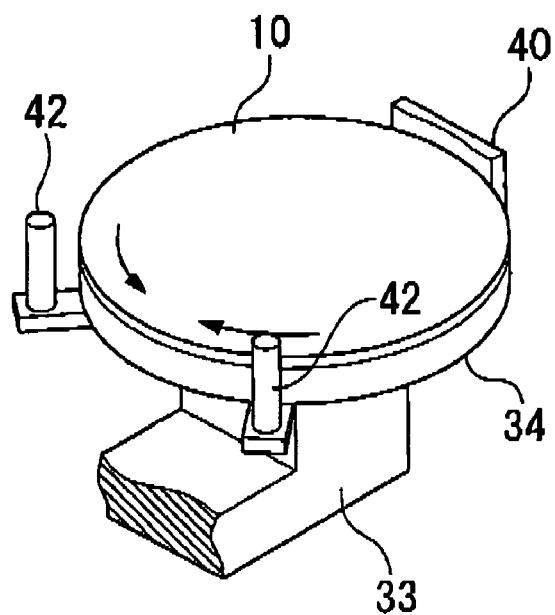

APPARATUS FOR MANUFACTURING SEMICONDUCTOR SUBSTRATES

BACKGROUND OF THE INVENTION

1. Field of the Invention

The present invention relates to an apparatus for manufacturing a semiconductor substrate used for manufacturing SIMOX (Separation by Implanted Oxygen) substrate by implanting oxygen ions into a semiconductor substrate of silicon and the like, and then applying a high-temperature treatment.

This application claims priority from Japanese Patent Application No. 2005-244656 filed on Aug. 25, 2005, the content of which is incorporated herein by reference.

2. Background Art

In a common batch-type ion implantation apparatus, for example, as shown in Patent Reference 1, multiple pieces of semiconductor substrate are mounted on multiple support disks equipped on one rotating plat-form and processed in a lump under vacuum.

An ion accelerated by necessary energy is implanted into a semiconductor substrate while being rotated like turning these support disks. As methods for uniformly implanting an ion in a semiconductor substrate, a method of scanning the support disks themselves in conformity to the turning of support disks or a method of scanning an ion beam only by turning support disks are given. In both methods, uniform ion implantation may be performed over the entire surface of all semiconductor substrates on the support disks.

Centrifugal force is utilized for the support of semiconductor substrates. Therefore, a structure of slightly inclining support disks for supporting the semiconductor substrates to the turning surface of the support disks to press the semiconductor substrates against the support disks is adopted.

If turning is inclined at only an angle $\alpha$ to the turning surface of the support disks, the semiconductor substrates are pressed against the support disks by a component of the centrifugal force in proportional to sine $\alpha$. The inclination $\alpha$ may not be increased too large in restricting the ion implantation.

Therefore, the semiconductor substrates fly off to the outside only by a frictional force at the rear of semiconductor substrates. Accordingly, members called stoppers for suppressing the fly-off of the semiconductor substrates is necessary.

These stoppers have a width, but the support disks are commonly turned at several hundred rpm or so, and the acceleration at this time is also a value of over 150 G (G: gravity acceleration). The semiconductor substrates are 12 in. in diameter and about 150 g, thus the stoppers must support a load (22.5 kg) which is 150 times as much as its own weight.

However, the semiconductor substrates may not be supported on the support disks only at peripheral contact positions by the stoppers. Substrate inner supports must also be provided for the semiconductor substrates at the inner periphery of the support disks.

Moreover, an ion beam current implanted into the semiconductor substrates must flow to the outside of the support disks and the like. Therefore, at least the stoppers or the substrate inner supports must be ensured as a current passage. Stoppers capable of ensuring contact with the semiconductor substrates by the centrifugal force are suitable for the passage of ion beam current.

Furthermore, heat generated in the semiconductor substrates due to ion implantation is put out through the support disks by radiation heat transfer from the entire rear face of the semiconductor substrates, but part of heat is also put out through the stoppers or the substrate inner supports.

In the manufacture of SIMOX substrate, absolute values of the film thickness of the SI (Silicon ON Insulator) layer and BOX (Buried Oxide) layer are decided by the acceleration voltage and the implantation rate during oxygen ion implantation. At this time, the film thickness also depends upon the temperature during implantation.

The ion implantation rate may be made uniform to a level at which the uniformity of the film thickness is not affected by control of above-mentioned scanning conditions. It is also possible to ensure a uniformity level of temperature during implantation by heating the substrates with a radiation heater having an area larger than the semiconductor substrates, for which implantation is performed at the temperature during implantation, and further using material with high adiabaticity or high heat insulativity and no conductivity in the contact part of the substrate inner supports.

In an ion implantation apparatus used for manufacturing the SIMOX substrate, semiconductor substrates must be heated to a desirable temperature. Therefore, a radiation heater, such as halogen lamp and the like is disposed in a vacuum vessel provided with above-mentioned support disks.

When ion implantation is performed, the support disks loaded with the semiconductor substrates are turned and then the semiconductor substrates are heated to a desired temperature by the radiation heater. Subsequently, an ion beam is raised to perform ion implantation while controlling the disks or scanning of the beam.

If the implantation rate reaches a set value for the entire surface of semiconductor substrates, the scan control is stopped at a position where the ion beam does not hit the semiconductor substrates, the radiation heater is cut off and the rotation of the support disks is stopped.

Recently, however, the SOI layer has tended to be extremely thinned in the SOI substrates including SIMOX and only slight non-uniformity of film thickness has not been allowed. As a result, the problem that prescribed film thickness uniformity could not be realized was known to arise in the prior art.

In view of the above problem, an object of the present invention is to provide an apparatus for manufacturing semiconductor substrates capable of forming a SOI layer and BOX layer in a uniform thickness as a whole.

(Patent Reference 1) Japanese Patent Application, Publication No. 2002-231176

SUMMARY OF THE INVENTION

If SIMOX semiconductor substrates are prepared by the ion implantation apparatus of the prior art, a region with uneven film thickness occurs in a substrate holding part and a contact part with semiconductor substrates of the support disks, particularly in the vicinity of stoppers for ensuring conductivity.

It is known that this is a reason the semiconductor substrates are heated by a large-area radiation heater, but the temperature of semiconductor substrates becomes lower than that of other regions due to heat extraction caused by heat conduction from the semiconductor substrates to the contact part of stoppers and heat extraction caused by radiation heat transfer from the semi-conductor substrates to the stoppers.

Based of the above research results, the present invention realizes an apparatus for manufacturing semiconductor substrates which may form a SOI layer and BOX layer of uniform thickness as a whole by adopting a constitution for suppressing a temperature drop of a part in contact with stoppers where an ion current outflows.

A first aspect of the apparatus for manufacturing semiconductor substrates of the present invention includes support disks; and holding units for holding semiconductor substrates on the support disks, wherein the semiconductor substrates held by the support disks are subjected to an ion implantation while the semiconductor substrates are revolved like orbital motion. The holding unit has a stopper which holds the brim of the semiconductor substrate and which joins with the support disk, a stopper holder which supports the stopper at the outer circumferential portion thereof and which is fixed to the support disk as being able to attached and removed, and a retaining member which retains the stopper to the support disk and which is fixed to the support disk as being able to attached and removed. The stopper is formed of a conductive material and has a heating unit which heats the stopper.

In the first aspect of the apparatus for manufacturing semiconductor substrates of the present invention, the heating unit may be provided at the back surface of the stopper which is on the opposite side from the side facing the brim of the semiconductor substrate.

The holding unit may be provided on the outer side of the revolving orbit of the revolving support disk.

The stopper holder is formed of a strong metallic material that sustains a centrifugal force acting on the holding unit.

A second aspect of the apparatus for manufacturing semiconductor substrates of the present invention includes support disks; and holding units for holding semiconductor substrates on the support disks, wherein the semiconductor substrates held by the support disks are subjected to an ion implantation while the semiconductor substrates are revolved like orbital motion. The holding unit has a stopper piece which holds the brim of the semiconductor substrate and which is formed of a conductive material, a stopper-piece holding member which holds the stopper piece, a stopper holder which supports the stopper-piece holding member at the outer circumferential portion thereof and which is fixed to the support disk as being able to attached and removed, and a retaining member which retains the stopper-piece holding member to the support disk and which is fixed to the support disk as being able to attached and removed. The stopper piece is connected to the support disk via a conducting member, and has a heating unit which heats the stopper-piece holding member.

In the second aspect of the apparatus for manufacturing the semiconductor substrates of the present invention, the heating unit may be provided at the back surface of the stopper-piece holding member which is on the opposite side from the side facing the stopper piece.

The holding unit may be provided on the outer side of the revolving orbit of the revolving support disk.

The stopper holder may be formed of a strong metallic material that sustains a centrifugal force acting on the holding unit.

A third aspect of the apparatus for manufacturing semiconductor substrates of the present invention includes support disks; and holding units for holding semiconductor substrates on the support disks, wherein the semiconductor substrates held by the support disks are subjected to an ion implantation while the semiconductor substrates are revolved like orbital motion. The holding unit has a stopper piece which holds the brim of the semiconductor substrate and which is formed of a conductive material, a stopper-piece supporting platform which supports the stopper piece, a stopper-piece holding member which holds the stopper piece and the stopper-piece supporting platform, a stopper holder which supports the stopper-piece holding member at the outer circumferential portion thereof and which is fixed to the support disk as being able to attached and removed, and a retaining member which retains the stopper-piece holding member to the support disk and which is fixed to the support disk as being able to attached and removed. The stopper-piece supporting platform and the stopper-piece holding member are formed of a material having a heat insulating property. The stopper piece is connected to the support disk via a conducting member, and has a heating unit which heats the stopper-piece holding member.

In the third aspect of the apparatus for manufacturing semiconductor substrates of the present invention, the stopper-piece holding member may contain a ceramic material or a quartz material which has a heat insulating property.

The heating unit may be provided at the back surface of the stopper-piece holding member which is on the opposite side from the side facing the stopper pieces.

The holding unit may be provided on the outer side of the revolving orbit of the turning support disk.

The stopper holder may be formed of a strong metallic material that sustains a centrifugal force acting on the holding unit.

A fourth aspect of the apparatus for manufacturing semiconductor substrates of the present invention includes support disks; and holding units for holding semiconductor substrates on the support disks, wherein the semiconductor substrates held by the support disks are subjected to an ion implantation while the semiconductor substrates are revolved like orbital motion. The holding unit has a stopper piece which holds the brim of the semiconductor substrate and which is formed of a conductive material, and a stopper holder which supports the stopper piece at the outer circumferential portion thereof and which is fixed to the support disk as being able to attached and removed. A conducting member which electrically connects the support disk and the stopper piece are provided.

The present invention enhances the temperature uniformity in the ion implantation and improves the film thickness uniformity of SOT layer and BOX layer of the SIMOX semiconductor substrates because heat escaping through the stoppers is compensated for by the heating unit.

BRIEF DESCRIPTION OF THE DRAWINGS

FIG. 3 is a lateral view of the rotary support device relating to this embodiment.

FIGS. 4A and 4B are schematic diagrams showing one example of a holding structure of the rotary support device holding a semiconductor substrate relating to this embodiment, FIG. 4A is a front view, and FIG. 4B is an A-C sectional view of FIG. 4A.

FIGS. 5A and 5B are schematic diagrams showing another example of a holding structure of the rotary support device holding a semiconductor substrate relating to this embodiment, FIG. 5A is a front view, and FIG. 5B is a D-O-E sectional view of FIG. 5A.

FIG. 6 is an oblique view showing a state in which a rotary support device relating to this embodiment holds a semiconductor substrate.

FIG. 8 is a related structural diagram showing a cross-section of one example of stopper in which FIG. 4 is viewed from a direction of arrow P.

FIG. 12A is measured values while heating at various heating values, and FIG. 12B show measured values while not heating.

FIG. 13A is measured values of a SIMOX semiconductor substrate manufactured while heating, and FIG. 13B show measured values of a SIMOX semiconductor substrate manufactured while not heating.

FIG. 14A is measured values of a SIMOX semiconductor substrate manufactured while heating, and FIG. 14B show measured values of a SIMOX semiconductor substrate manufactured while not heating.

PREFERRED EMBODIMENTS

Preferred embodiments of the present invention are described hereafter with reference to the accompanying drawings. The present invention is not limited to the following embodiments and constituent elements of these embodiments may be appropriately combined.

First, the ion implantation of an apparatus of manufacturing semiconductor substrates are described by FIG. 1 to FIG. 7.

Figure 1:
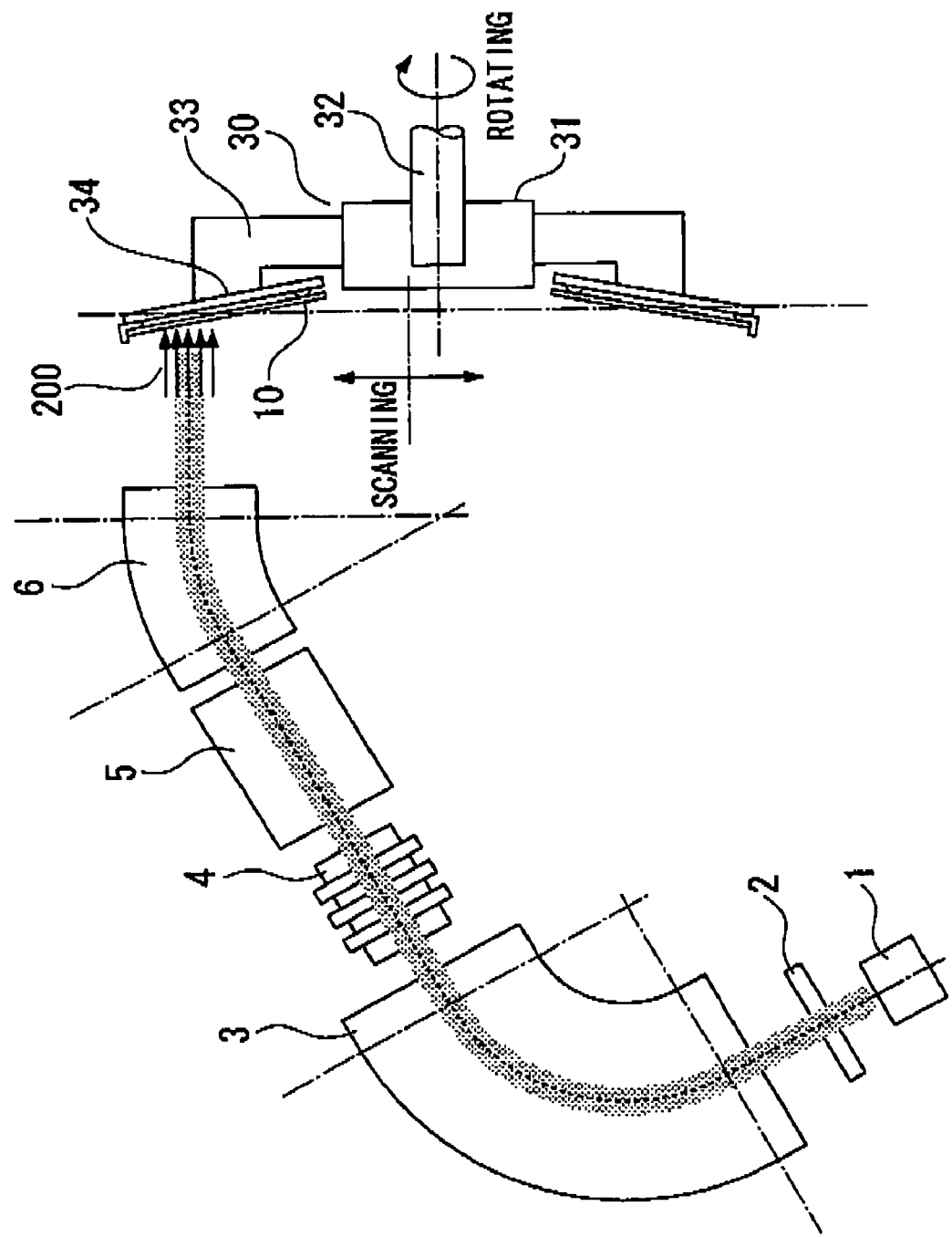
FIG. 1 is a schematic diagram showing an ion implantation apparatus relating to this embodiment.

As shown in FIG. 1, oxygen ion generated in an ion source 1 enters a mass separator 3 accelerated by a lead-out electrode 2. Unnecessary ions and impurities are removed and only the necessary ion is withdrawn by applying a magnetic field corresponding to the ion species implanted by the mass separator 3.

The oxygen ion in which impurities are removed is implanted into semiconductor substrates 10 by controlling the path and shape of an ion beam 200 further accelerated by a post-accelerating electrode 4 and deflecting it at 30o by a deflector 6.

A rotary platform 30 has a rotary box 31, a rotary shaft 32 fitted to the rotary box 31, multiple arms 33 provided and radially arranged in the rotary box 31 and support disks 34. The support disks 34 are rotated, turning by the rotation of a rotary shaft 32. The semiconductor substrates 10 are held and turned on these turning support disks 34.

The support disks 34 are inclined as shown in FIG. 3. The support disks 34 with an angle α to the turning surface are so placed that the turning periphery side becomes the upper side and the turning inner side becomes the lower side. That is, the support disks 34 have such an inclina-tion that the mounting face for mounting the semiconductor substrates 10 faces to the rotation axis of the rotary box 31.

Figure 2:
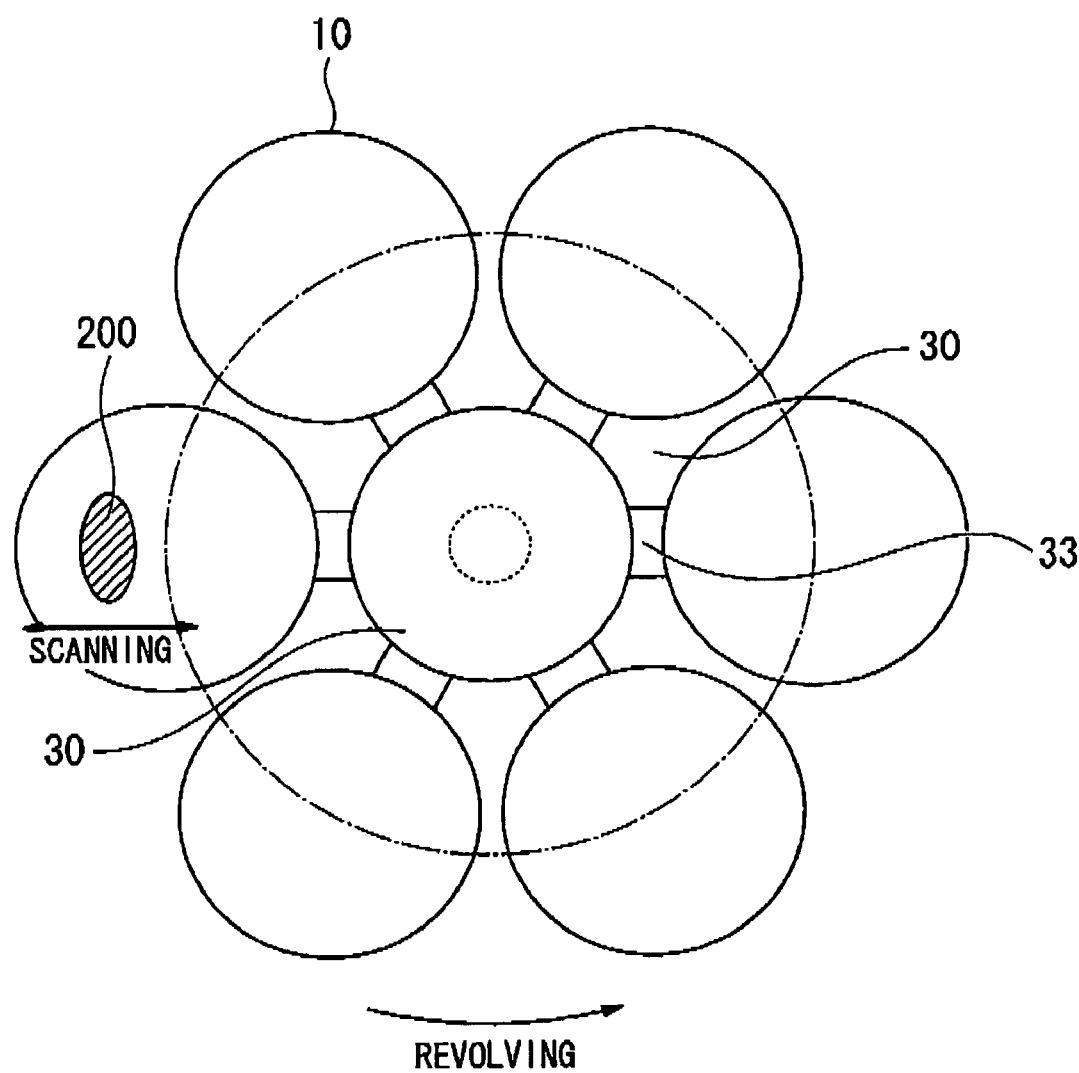
FIG. 2 is a plane diagram in which semiconductor substrates held by a rotary support device relating to this embodiment is viewed from above.

The implantation of ion beam 200 into the semiconductor substrates 10 held at the sup-port disks 34 of the rotary platform 30 and rotating like turning is performed as shown in FIG. 2, FIG. 3. The implantation of oxygen ion is performed over the entire surface of semiconductor substrates 10 by scanning the implanting ion beam 200 in the direction of illustrated arrows.

Moreover, the implantation of oxygen ion may be performed over the entire surface even if the rotary platform 30 is scanned in the direction of illustrated arrows as shown in FIG. 1.

FIGS. 4A and 4B show a holding unit for a semiconductor substrate.

FIG. 4A is a diagram in which the semiconductor substrate held by the holding unit is viewed from the front, and FIG. 4B is a diagram showing an A-C cross-section of FIG. 4A.

A stopper 40 of the holding unit is provided so as to locate on the turning periphery side of the turning support disk 34. A substrate inner supports 41 are provided near to the turning inner side. The semiconductor substrate 10 is held by the stopper 40 and the substrate inner sup-ports 41.

A centrifugal force acting on the semiconductor substrate 10 due to turning is stopped by the stopper 40, therefore the semiconductor substrate 10 is surely held even if it is rotated like turning at a high speed of about several hundred rpm.

As described above, the support disk 34 supporting the semiconductor substrate has an inclination such that the mounting face for mounting the semiconductor substrate 10 faces the rotating axis of rotary box 31. Therefore, the semiconductor substrate 10 is surely held by the support disk 34 because is pressed against the support disk 34 by the centrifugal force due to high-speed turning.

FIGS. 5A and 5B show another embodiment of the holding unit.

FIG. 5A is a diagram in which the semiconductor substrate held by the holding unit is viewed from the front, and FIG. 5B is a diagram showing a D-O-C cross-section of FIG. 5A.

This embodiment is different from the former embodiment in that two adjacent stoppers 40 are provided and one substrate inner support 41 is provided and has a common constitution in others.

The holding of the holding unit is further illustrated by citing FIG. 6.

A stopper 40 is provided on the turning periphery side of the support disk 34, and movable chucks 42 are provided on the turning inner side. A stopper groove 43 is provided on the inner side of the stopper 40.

The semiconductor substrate 10 is set on the support disk 34 and pressed against the stop-per 40 by rotating the chucks 42 in arrow directions. The brim of semiconductor substrate 10 is joined with the stopper groove 43 of the stopper 40, thus the semiconductor substrate 10 is surely held.

Figure 7:
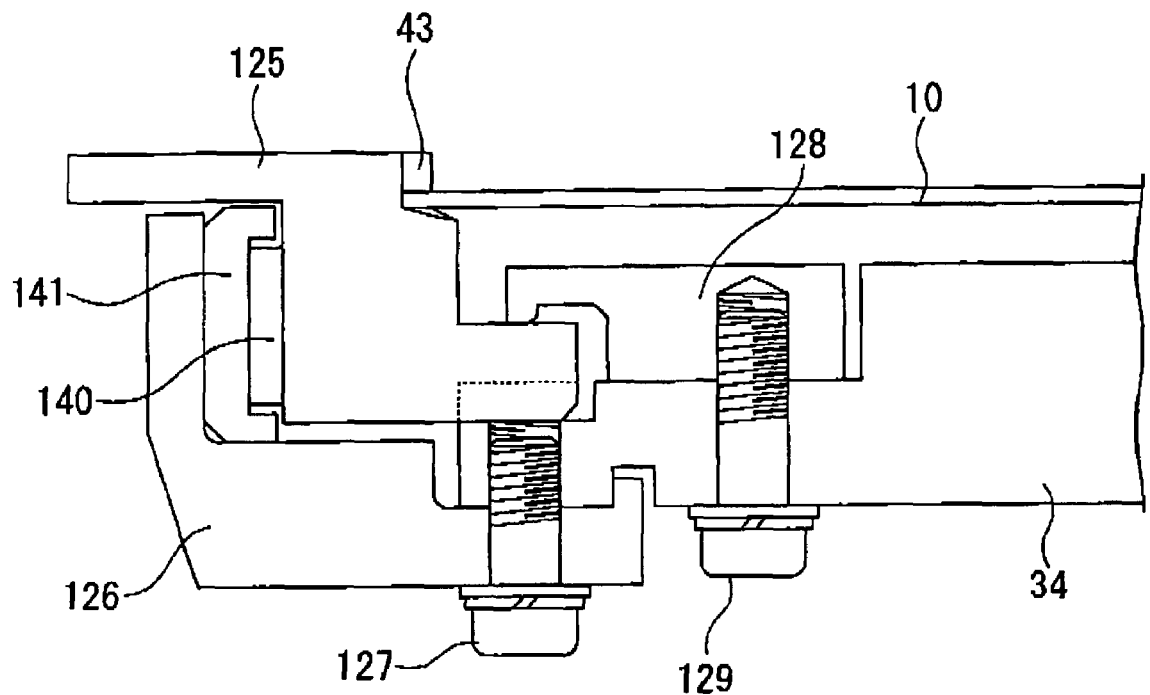
FIG. 7 is a related structural diagram showing a cross-section of one example of a stopper showing an A-B cross-section of FIG. 4.
Figure 8:
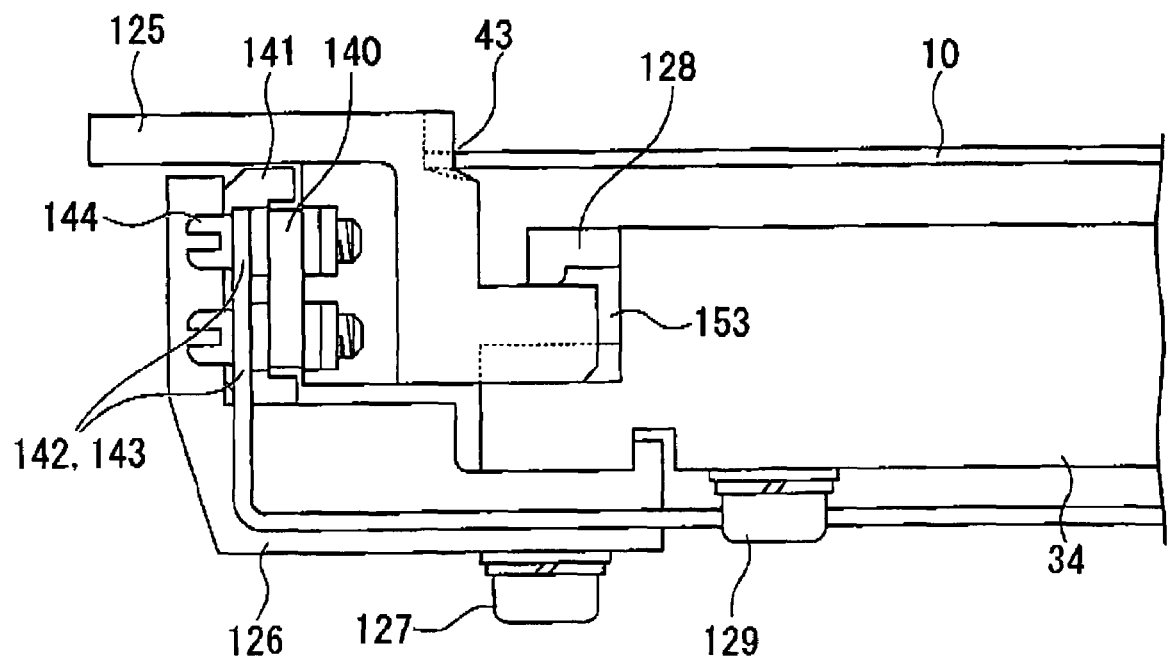

The related structure of stopper being the main part of the present invention is described by citing FIG. 7, FIG. 8 next.

The holding unit forming the principal part of the related structure of stopper has a stopper 125, a stopper holder 126 and a retaining member 128.

The stopper 125 of the holding unit is provided on the turning periphery side of the support disk 34. This stopper 125 is made of silicon or carbon so as to keep the conductivity and has the stopper groove 43 for receiving the brim of semiconductor substrate 10.

The stopper 125 is placed so as to join with the support disk 34, and its periphery side is supported by a stopper holder 126. The stopper holder 126 is formed of a metallic material such as an aluminum alloy and the like. for sustaining the load of centrifugal force. The stopper holder 126 is fastened and fixed to the support disk 34 with a fastening screw 127.

The retaining member 128 for retaining the stopper 125 to the support disk 34 is fastened and fixed to the support disk 34 with a fastening screw 129.

The stopper 125 is attachably/detachably mounted to the support disk 34 by the stopper holder 126 and the retaining member 128.

An ion beam current implanted into the semiconductor substrate 10 flows to the support disk 34 via the stopper 125 having conductivity and made of silicon or carbon.

Moreover, the implantation conditions of the ion beam current are as follows.

Acceleration voltage: 163 keV, implantation rate: 4.0 ($10^{17}$/cm$^2$, beam current: 70 mA, heating temperature: 770 K. A heating unit is described below.

The heating unit is provided at the back of stopper 125 opposite of the brim of the semiconductor substrate 10. The heating unit has a heater 140 and a heater supporting adiabatic plate 141. Feed lines 142, 143 are fastened and fixed to both terminals of the heater 140 by stop screws 144. In this embodiment, the both terminals are provided to keep grounding potentials of power supply and beam current of the heater 140 independently. However, it is also possible to connect one terminal to the support disk 34.

The heater 140 is joined so as to closely adhere to the back of stopper 125 and well per-form heat transfer. The heating unit is housed in a housing space provided between the back of stopper 125 and the inner side of stopper holder 126 so that the stopper holder 126 also serves as a support of the heating unit.

The heater desirably has such a constitution that a foil used for conducting path is pasted to a ceramic insulation substrate resistant to a high temperature of 1,000K or above. Heat may be compensated for by the heater even if the heat transferred from the stopper 125 escapes due to the related structure of stopper 125 of this embodiment. Temperature drop on a site in contact with the stopper 125 in the semiconductor substrate 10 is measured by ion implantation. It was confirmed that the temperature drop is suppressed by 10% to 5% in comparison with one provided with no heating unit.

This enhances the temperature uniformity of the semiconductor substrate and improves the film thickness uniformity of SOI layer and BOX layer of the SIMOX semiconductor substrate.

Figure 9:
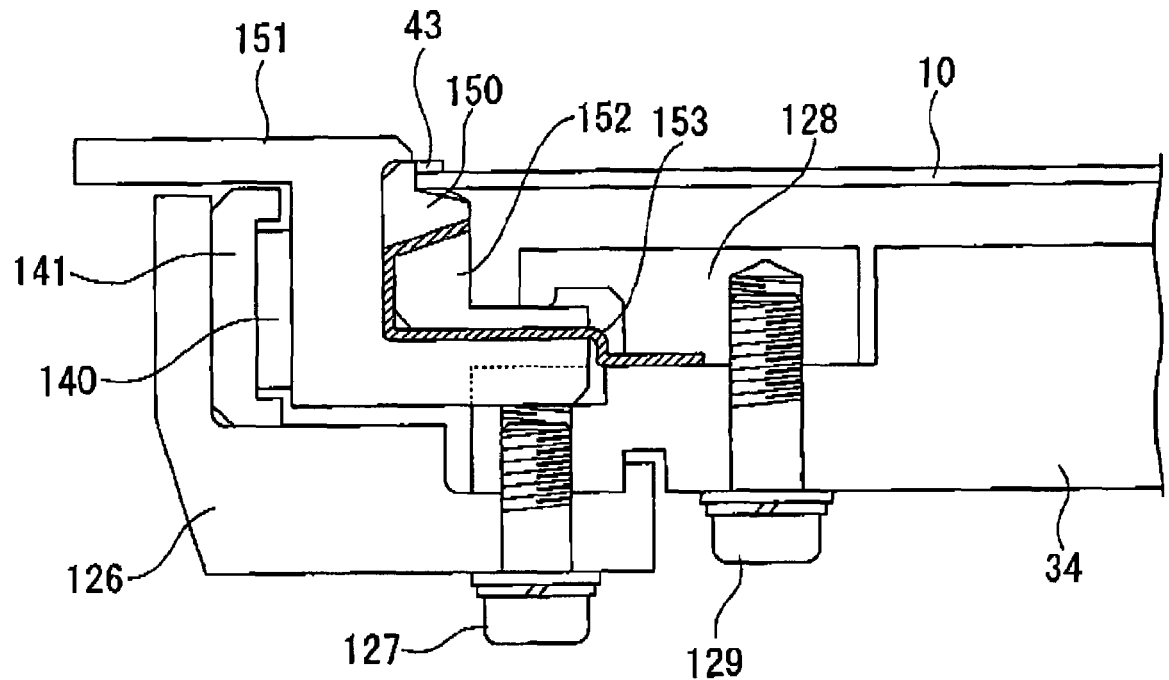
FIG. 9 is a related structural diagram showing a cross-section of another example of a stopper relating to this embodiment.
Figure 10:
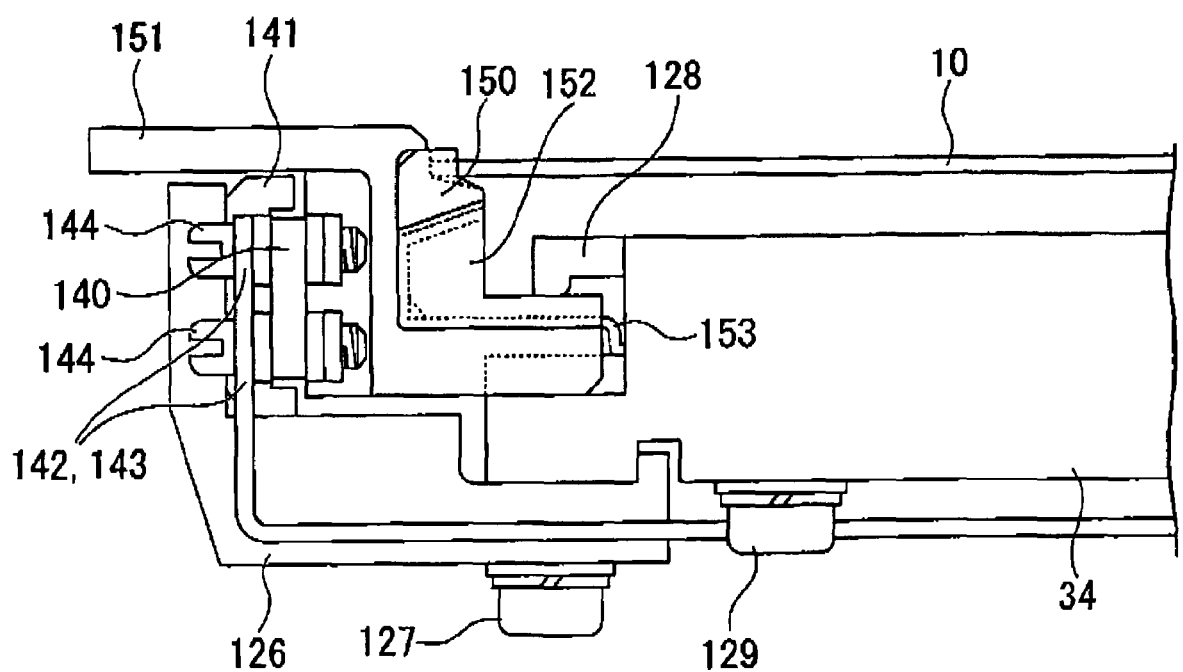
FIG. 10 is a related structural diagram showing a lateral surface of another example of a stopper relating to this embodiment.

Another embodiment of the related structure of stopper is described by citing FIG. 9 and FIG. 10.

Here, the features of this embodiment are mainly described, the same symbols are attached to parts common to the former embodiment examples and their description is omitted.

A holding unit forming the principal part of the related structure of stopper has a stopper piece 150, a stopper piece holding member 151, a stopper holder 126, a stopper piece support platform 152 and a retaining member 128.

The stopper piece 150 of the holding unit is provided on the turning periphery side of support disk 34. This stopper piece 150 is made of a carbon conductive material and has a stopper groove 43 for receiving the brim of a semiconductor substrate 10. The stopper piece 150 made of carbon also has a high radiance of heat.

The stopper piece holding member 151 holds the stopper piece 150 and the stopper piece support platform 152.

The stopper piece holding member 151 and the stopper piece support platform 152 are formed of quartz or ceramic. The stopper piece holding member 151 and the stopper piece support platform 152 made of quartz have insulativity, have adiabaticity by which heat is hard to transfer, and is also excellent in respect of mechanical strength. They may suppress the occurrence of foreign matters during ion implantation.

The stopper piece holding member 151 and the stopper piece support platform 152 have tapered surfaces in their facing portion. A conducting member 153 is interposed between the tapered surfaces so as to sandwich it. The conducting member 153 extends to be clamped by the stopper piece holding member 151 and the stopper piece support platform 152 and further clamped by the retaining member 128 and the support disk 34. An aluminum foil or aluminum thin sheet of about 0.02 to 0.1 mm is used as the conducting member 153.

An ion beam current implanted into the semiconductor substrate 10 flows to the support disk 34 via the stopper piece 150 and the conducting member 153. Implantation conditions of the ion beam current are same as in the former embodiment.

The conducting member 153 is strongly and firmly clamped because it is clamped by the tapered surfaces of the stopper piece 150 and the stopper piece support platform 152. The stopper piece 150 is pressed against the stopper piece holding member 151 and fixed strongly and firmly by a pressing force caused by joining of the tapered surfaces.

A heating unit is provided at the back of stopper piece holding member 151 opposite the stopper piece 150.

Heat transfer from the heater 140 to the stopper piece 150 is performed via the stopper piece holding member 151 having adiabaticity, therefore it is expected to need more heating value of the heater 140 than the former embodiment described by FIG. 7 and FIG. 8. However, surfacing is needed to increase the contact heat resistance between the stopper piece holding member 151 and the stopper piece support platform 152. Consequently, the heating value of the heater may be reduced by making the heating volume smaller than the stopper 125 of former embodiment only by the size of stopper piece support platform 152.

Carbon having high heat radiance is used for the stopper piece 150, and the stopper piece holding member 151 and the stopper piece support platform 152 are formed of quartz which is hard to transfer heat. The radiation heat transfer effect on the stopper piece 150 are utilizable because the surface temperature of the heater 140 becomes 1,000K or above. The heat radiation effect may be increased by facing the heater 140 and the stopper piece 150 so that their lengths in the width direction are 20 to 25 mm, respectively and suppressing the width of conducting member 153 shielding the radiation to 3 to 4 mm. The necessary heating value of the heater 140 is decreased by the radiation heat transfer effect.

The stopper piece 150 of this embodiment is much smaller than the stopper 125 of the former embodiment, therefore the radiation heat withdrawn from the semiconductor substrate 10 by the stopper piece 150 is reduced. This enables lowly suppressing the heat generation of the heater 140.

As described above, the stopper of this embodiment enables to suppress the partial temperature drop of the semiconductor substrate 10 at a smaller heating value of the heater 140 than that of the former embodiment described by FIG. 7 and FIG. 8.

Figure 11:
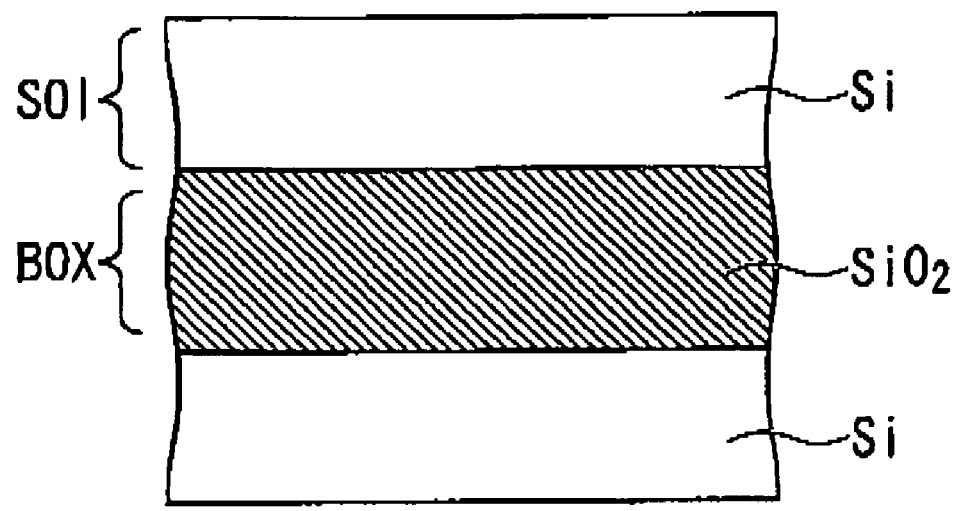
FIG. 11 is a sectional view of a semiconductor substrate relating to this embodiment.

FIG. 11 shows a cross-section of SIMOX semiconductor substrate. The surface side is SOI layer and the inner side is BOX layer.

Figure 12A:
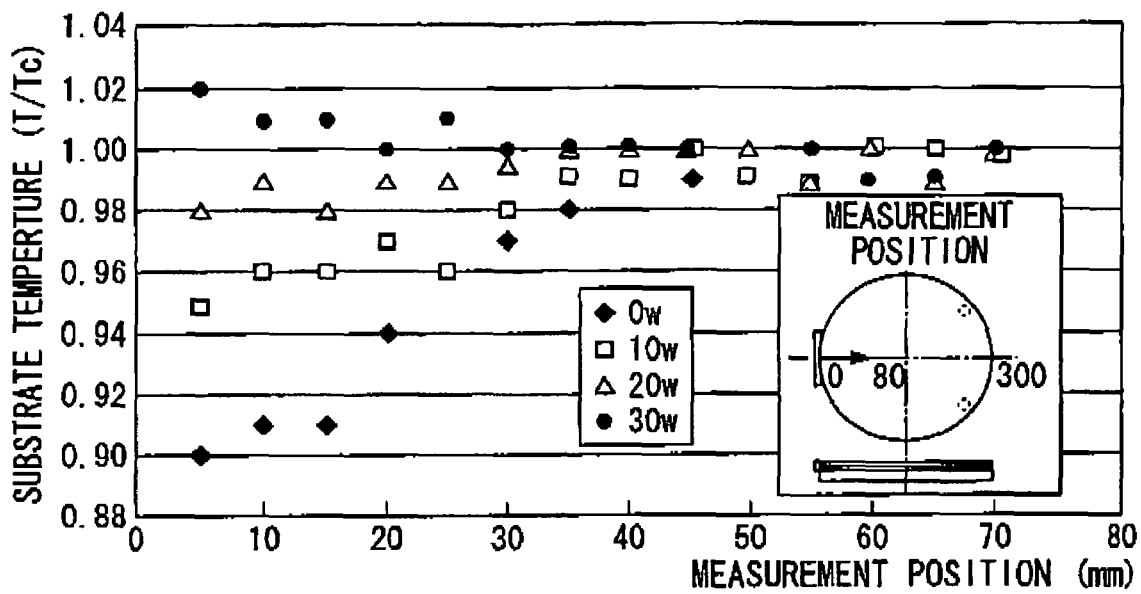
FIGS. 12A and 12B are diagrams showing measured values of temperature distribution of the upside of a semiconductor substrate.
Figure 12B:
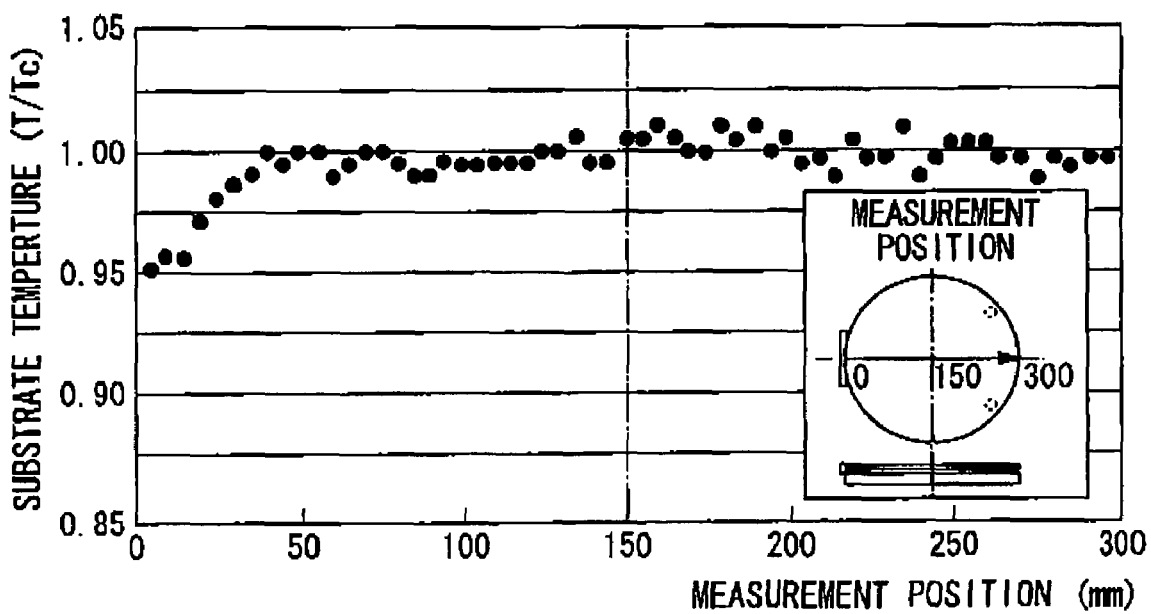

FIGS. 12A and 12B show a surface temperature distribution of the semiconductor substrate during ion implantation.

FIG. 12A shows measured values measured during ion beam implantation at various heating values of the heater. FIG. 12B shows measured values measured during ion beam implantation by manufacturing apparatus provided with no heater. T is the measured value, and Tc is the reference value. The reference value is made to 1.0.

The horizontal axis represents a range of going apart from a part in contact with the stopper. The vertical axis represents the measured temperature.

As shown in FIG. 12B, it is known that the temperature is lower than the reference value Tc and approaches to the reference value with going apart from the stopper when in contact with the stopper.

As shown in FIG. 12A, it is known that the temperature drop when in contact with the stopper is slowly corrected by increasing the heating value of the heater. For the heating value, the temperature is the best at 25 W, conversely, it is more than the reference value at 30 W.

The temperature of semiconductor substrate during ion implantation changes with implantation energy, beam current value and temperature of radiation heater. In order to uniform the temperature distribution on the semiconductor substrate during ion implantation, it is necessary to adjust the exothermic input power of the heater suited to the implantation conditions.

Figure 13A:
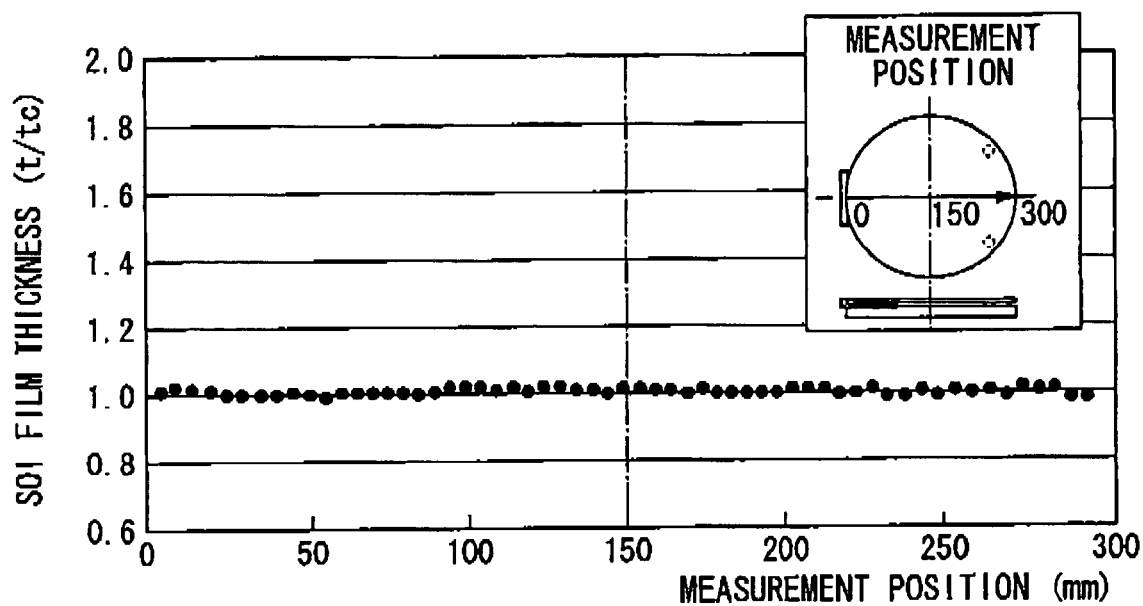
FIGS. 13A and 13B are diagrams showing measured values of film thickness distribution of SOI layer.
Figure 13B:
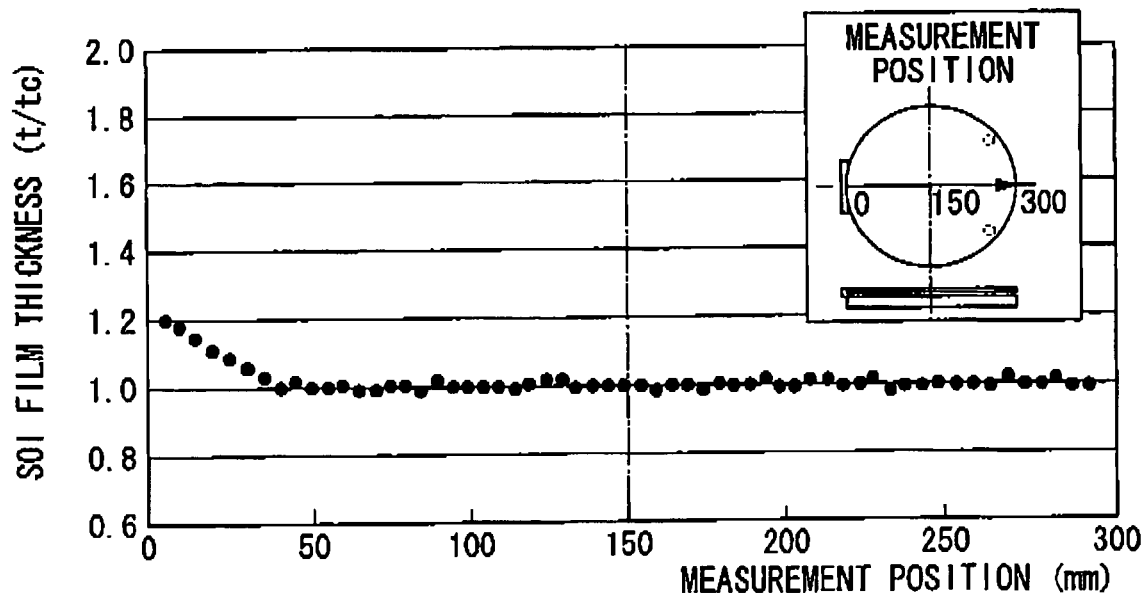

FIGS. 13A and 13B show measured values of film thickness distribution of SOI layer.

The measuring SIMOX semiconductor substrate is prepared by setting the input of heater to 25 W. The implantation conditions of ion beam are same as those of the formerly described embodiment.

FIG. 13A is a SIMOX semiconductor substrate manufactured while heating with the heater, and FIG. 13B is a SIMOX semiconductor substrate manufactured while not heating with the heater. In FIGS. 13A to 13B, t is the measured value, and tc is the reference value. The reference value is made to 1.0. As shown in FIG. 13A, 13B, it is known that the film thickness distribution of SOI layer is made uniform over the entire layer by heating with the heater.

Figure 14A:
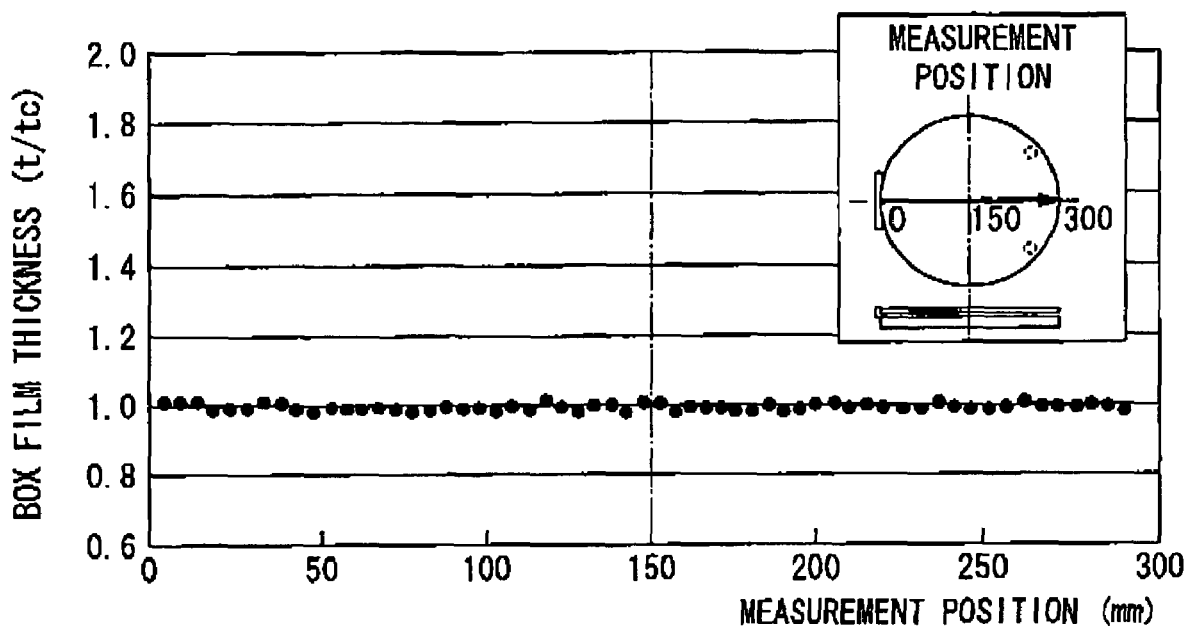
FIGS. 14A and 14B are diagrams showing measured values of film thickness distribution of BOX layer.
Figure 14B:
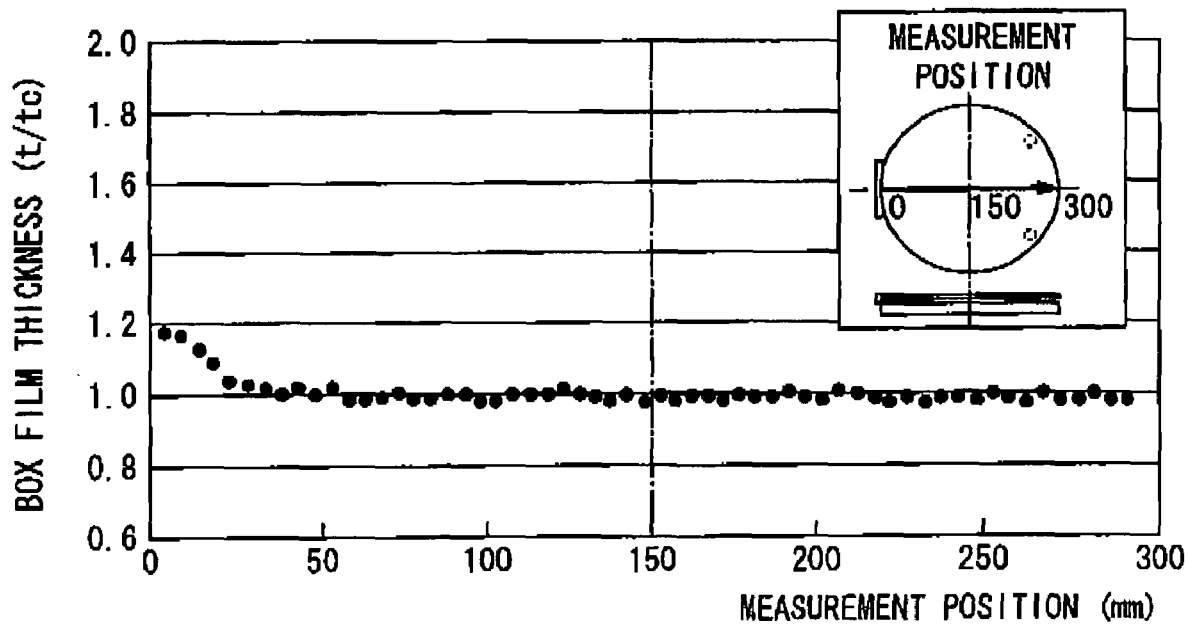

FIGS. 14A and 14B show measured values of the film thickness distribution of BOX layer.

The measuring SIMOX semiconductor substrate is prepared by setting the input of heater to 25 W. The implantation conditions of ion beam are same as those of the formerly described embodiment.

FIG. 14A is a SIMOX semiconductor substrate manufactured while heating with the heater, and FIG. 14B is a SIMOX semiconductor substrate manufactured while not heating with the heater. In FIGS. 14A to 14B, t is the measured value, and tc is the reference value. The reference value is made to 1.0. As shown in FIG. 14A, 14B, the film thickness distribution of BOX layer is made uniform over the entire layer by heating with the heater.

As shown in FIG. 13 and FIG. 14, a thick film of SIO layer, BOX layer when in contact with the stopper is not found and a good SIMOX semiconductor substrate made uniform over the whole is provided by beating with the heater.

Some preferred embodiments of the invention have been described above, although these embodiments are considered in all respects as being illustrative and not limiting. Those skilled in the art will appreciate that various additions, omissions, substitutions and other modifications are possible without departing from the scope of the invention as disclosed in the accompanying claims.

What is claimed is:

1. An apparatus for manufacturing semiconductor substrates, the apparatus comprising: support disks; and holding units for holding semiconductor substrates on said support disks, wherein said semiconductor substrates held by said support disks are subjected to an ion implantation while said semiconductor substrates are revolved like orbital motion, said holding unit has a stopper which holds the brim of said semiconductor substrate and which joins with said support disk, a stopper holder which supports said stopper at the outer circumferential portion thereof and which is fixed to said support disk as being able to attached and removed, and a retaining member which retains said stopper to said support disk and which is fixed to said support disk as being able to attached and removed, and said stopper is formed of a conductive material and has a heating unit that is fixed to the stopper and heats the stopper.

2. An apparatus for manufacturing semiconductor substrates according to claim 1, wherein said heating unit is provided at the back surface of said stopper which is on the opposite side from the side facing said brim of said semiconductor substrate.

3. An apparatus for manufacturing semiconductor substrates according to claim 1, wherein said holding unit is provided on the outer side of the revolving orbit of said revolving support disk.

4. An apparatus for manufacturing semiconductor substrates according to claim 3, wherein said stopper holder is formed of a strong metallic material that sustains a centrifugal force acting on said holding unit.

5. An apparatus for manufacturing semiconductor substrates, the apparatus comprising: support disks; and holding units for holding semiconductor substrates on said support disks, wherein said semiconductor substrates held by said support disks are subjected to an ion implantation while said semiconductor substrates are revolved like orbital motion, said holding unit has a stopper piece which holds the brim of said semiconductor substrate and which is formed of a conductive material, a stopper-piece holding member which holds said stopper piece, a stopper holder which supports said stopper-piece holding member at the outer circumferential portion thereof and which is fixed to said support disk as being able to attached and removed, and a retaining member which retains said stopper-piece holding member to said support disk and which is fixed to said support disk as being able to attached and removed, and said stopper piece is connected to said support disk via a conducting member, and has a heating unit that is fixed to said stopper-piece holding member and heats said stopper-piece holding member.

6. An apparatus for manufacturing semiconductor substrates according to claim 5, wherein said heating unit is provided at the back surface of said stopper-piece holding member which is on the opposite side from the side facing said stopper piece.

7. An apparatus for manufacturing semiconductor substrates according to claim 5, wherein said holding unit is provided on the outer side of the revolving orbit of said revolving support disk.

8. An apparatus for manufacturing semiconductor substrates according to claim 7, wherein said stopper holder is formed of a strong metallic material that sustains a centrifugal force acting on said holding unit.

9. An apparatus for manufacturing semiconductor substrates, the apparatus comprising: support disks; and holding units for holding semiconductor substrates on said support disks, wherein said semiconductor substrates held by said support disks are subjected to an ion implantation while said semiconductor substrates are revolved like orbital motion, said holding unit has a stopper piece which holds the brim of said semiconductor substrate and which is formed of a conductive material, a stopper-piece supporting platform which supports said stopper piece, a stopper-piece holding member which holds said stopper piece and said stopper-piece supporting platform, a stopper holder which supports said stopper-piece holding member at the outer circumferential portion thereof and which is fixed to said support disk as being able to attached and removed, and a retaining member which retains said stopper-piece holding member to said support disk and which is fixed to said support disk as being able to attached and removed, and said stopper-piece supporting platform and said stopper-piece holding member are formed of a material having a heat insulating property, and said stopper piece is connected to said support disk via a conducting member, and has a heating unit that is fixed to said stopper-piece holding member and heats said stopper-piece holding member.

10. An apparatus for manufacturing semiconductor substrates according to claim 9, wherein said stopper-piece holding member contains a ceramic material or a quartz material which has a heat insulating property.

11. An apparatus for manufacturing semiconductor substrates according to claim 9, wherein said heating unit is provided at the back surface of said stopper-piece holding member which is on the opposite side from the side facing said stopper pieces.

12. An apparatus for manufacturing semiconductor substrates according to claim 9, wherein said holding unit is provided on the outer side of the revolving orbit of said turning support disk.

13. An apparatus for manufacturing semiconductor substrates according to claim 12, wherein said stopper holder is formed of a strong metallic material that sustains a centrifugal force acting on said holding unit.

14. An apparatus for manufacturing semiconductor substrates, the apparatus comprising: support disks; and holding units for holding semiconductor substrates on said support disks, wherein said semiconductor substrates held by said support disks are subjected to an ion implantation while said semiconductor substrates are revolved like orbital motion, said holding unit has a stopper piece which holds the brim of said semiconductor substrate and which is formed of a conductive material, and a stopper holder which supports said stopper piece at the outer circumferential portion thereof and which is fixed to said support disk as being able to attached and removed, a conducting member which electrically connects said support disk and said stopper piece are provided, and said stopper piece has a heating unit that is fixed to the stopper piece and heats the stopper piece.

* * * * *